United States Patent [19]
Harris et al.

[11] Patent Number: 5,736,950
[45] Date of Patent: Apr. 7, 1998

[54] SIGMA-DELTA MODULATOR WITH TUNABLE SIGNAL PASSBAND

[75] Inventors: Frederick J. Harris, Lemon Grove; Robert W. Caulfield; William H. McKnight, both of San Diego, all of Calif.

[73] Assignee: The United States of America as represented by the Secretary of the Navy, Washington, D.C.

[21] Appl. No.: 384,819

[22] Filed: Jan. 31, 1995

[51] Int. Cl.⁶ ............................................. H03M 3/02
[52] U.S. Cl. ...................................... 341/143; 341/166
[58] Field of Search .................................. 341/143, 166; 375/247, 295, 316; 455/120, 123, 125

[56] References Cited

U.S. PATENT DOCUMENTS

| | | |
|---|---|---|
| 4,654,863 | 3/1987 | Belfield et al. . |
| 4,726,037 | 2/1988 | Jayant . |
| 4,792,794 | 12/1988 | Heitmann . |
| 4,829,299 | 5/1989 | Mandell . |
| 4,862,169 | 8/1989 | Van Bavel et al. . |
| 4,866,442 | 9/1989 | Steim et al. ............................ 341/143 |
| 4,876,543 | 10/1989 | Van Bavel . |
| 4,920,544 | 4/1990 | Endo et al. . |
| 4,940,977 | 7/1990 | Mandell . |
| 4,977,403 | 12/1990 | Larson . |
| 5,027,119 | 6/1991 | Toyomaki . |
| 5,027,120 | 6/1991 | Thurston . |
| 5,030,952 | 7/1991 | Ledzius et al. . |
| 5,055,846 | 10/1991 | Welland . |
| 5,103,229 | 4/1992 | Ribner . |
| 5,148,166 | 9/1992 | Ribner . |
| 5,148,167 | 9/1992 | Ribner . |

(List continued on next page.)

OTHER PUBLICATIONS

Uchimura et al., "Oversampling A–to–D and D–to–A Converters with Multistage Noise Shaping Modulators", *IEEE Transactions on Acoustics, Speech, and Signal Processing*, vol. 36, No. 12, Dec. 1988, pp. 1899–1905.

(List continued on next page.)

*Primary Examiner*—Marc S. Hoff
*Attorney, Agent, or Firm*—Harvey Fendelman; Michael A. Kagan; Peter A. Lipovsky

[57] ABSTRACT

A band-pass sigma-delta modulator includes a translator for tuning to a selected signal passband within the tuning range of the modulator. In a network implementation, the translator is integral with each integrator associated with the sigma-delta modulator(s). The translator can comprise a network having a transfer function defined in the Z-domain as $(Z\alpha-1)/(Z-\alpha)$, where $-1 \leq \alpha \leq 1$ defines the tuning. The value of $\alpha$ is defined as $\alpha = \cos(2\pi f_{gm}/f_s)$, where $f_{gm}$ is the geometric mean frequency of the passband and $f_s$ is the input sample frequency of the sigma-delta modulator(s). The invention can benefit many signal processing applications such as, for example, A/D, D/A and D/D converters; and digital communication systems including digital radio and digital TV. In digital communications (e.g., radio, TV, etc.), the invention can be used where it is desirable to digitize the full tuning range or bandwidth of a receiver at an intermediate frequency early in the processing chain, thus allowing digital tuning or mixing of the desired signal. Such digital mixing or tuning overcomes the limitations of analog mixers/receivers, for example limited linearity in dynamic range as well as the problems associated with aliasing, artifacts, ghosts, harmonics, distortion, gain and phase mismatch, etc. The sigma-delta modulator of the invention also provides variable bandwidth, is operationally stable and is easily and inexpensively realized.

21 Claims, 5 Drawing Sheets

U.S. PATENT DOCUMENTS

| | | |
|---|---|---|
| 5,157,395 | 10/1992 | Del Signore et al. . |
| 5,162,799 | 11/1992 | Tanimoto . |
| 5,181,032 | 1/1993 | Ribner . |
| 5,208,594 | 5/1993 | Yamazaki . |
| 5,248,972 | 9/1993 | Karema et al. . |
| 5,278,559 | 1/1994 | Yazawa . |
| 5,298,900 | 3/1994 | Mauthe et al. . |
| 5,311,181 | 5/1994 | Ferguson, Jr. et al. ............... 341/143 |
| 5,442,353 | 8/1995 | Jackson ................................. 341/143 |
| 5,469,475 | 11/1995 | Voorman ............................... 375/247 |
| 5,500,645 | 3/1996 | Ribner et al. ......................... 341/143 |

OTHER PUBLICATIONS

Matsuya et al., "A 16–bit Oversampling A–to–D Conversion Technology Using Triple–Integration Noise Shaping", *IEEE Journal of Solid–State Circuits*,vol. SC–22, No. 6, Dec. 1987, pp. 921–929.

Harris et al., "Use of allpass networks to tune the center frequency of sigma delta modulators," Conference Record of the Twenty–Seventh Asilomar Conference on Signals, Systems, and Computers, IEEE Comput. Soc. Press, vol. 2, pp. 1230–1234. 1993.

Harris et al., "New architectures with distributed zeros for improved noise shaping of delta–sigma analog to digital converters," Conference Record of The Twenty–Seventh Asiolomar Conference on Signals, Systems, and Computers, IEEE Comput. Soc. Press, vol. 1 pp. 421–425. 1993.

SIGMA-DELTA MODULATOR WITH TUNABLE SIGNAL PASSBAND

STATEMENT OF GOVERNMENT INTEREST

The invention described herein may be manufactured and used by or for the Government of the United States for governmental purposes Without the payment of any royalties thereon or therefor.

CROSS-REFERENCE TO RELATED APPLICATION

This application is related to the co-pending application titled "Distributed Quantization Noise Transmission Zeros in Cascaded Sigma-Delta Modulators", assigned Ser. No. 08/381,665, by the same inventors of this application.

FIELD OF THE INVENTION

The present invention relates to the field of devices that convert analog signals to quantized or digital signals, convert digital signals to analog signals, and convert between digital signals represented by $B_1$ bits and digital signals represented by $B_2$ bits where $B_1>B_2$, and more particularly to a sigma-delta modulator having a tunable signal passband.

BACKGROUND OF THE INVENTION

A type of signal modulator used in a wide variety of signal processing applications is known as the sigma-delta modulator. This modulator is also known as a delta-sigma modulator. Broadly speaking, a sigma-delta modulator is a sampled-data circuit of either analog or digital form. The circuit includes a quantizer having a small number of quantizing levels operating within a feedback loop. The small number of quantizing levels creates a large quantization (noise) error. The sigma-delta modulator functions to reduce the noise of the modulator's quantizer within a specified bandwith to a level associated with that of a quantizer having a significantly greater number of quantization levels. Thus, the sigma-delta modulator can achieve significantly reduced quantization noise over a specified bandwidth. Accordingly, analog-to-digital (A/D), digital-to-digital (D/D) and digital-to-analog (D/A) converters are frequently based on sigma-delta modulator design.

For example, in an A/D conversion scenario, a sigma-delta modulator will operate on an oversampled analog input signal, and will feature a forward path with one or more integrators and a low resolution quantizer with loop feedback (loop output signal). For A/D conversion, the output of the sigma-delta modulator is typically fed through a digital low-pass or bandpass down-sampling output filter known as a decimation filter. As previously explained, the modulator's quantizers introduce error associated with the quantization (noise error). The noise error or noise power is spectrally shaped and typically suppressed within a design bandwidth (near d.c. for a baseband system or near an arbitrary non-zero frequency for a carrier based system) that is determined by the modulator's circuitry and that is reflected in the noise transfer function (NTF) defined by the particular circuitry. The NTF must be stopband over the design bandwidth so that the signal of interest resides in a low quantization error environment. The noise power residing outside the design bandwidth is filtered out by the decimation filter matched to the design bandwidth, i.e., either low-pass or bandpass. This conventional sigma-delta modulator type A/D converter operates on the principle known as noise shaping.

To suppress the noise error over the design bandwidth, the NTF is typically designed to supply one or more transmission zeros within the design bandwidth so that the noise power in the design bandwidth is suppressed along with an associated increase in noise power outside the design bandwidth. As more transmission zeros are added in the NTF, the order of the modulator increases as does the noise error suppression over the design bandwidth.

The sigma-delta modulator can include multiple integrators in association with a single quantizing loop or can consist of a cascaded or multiple-stage structure arranged so that a subsequent quantizing stage operates to measure and cancel or suppress the noise error generated by a previous stage. In doing this, the noise error levels are further reduced within the design bandwidth.

Reduced noise power levels are achieved by the filtering effect of the high order zeros in the NTF which can, for example, be obtained (1) through the use of a series of multiple integrators serving as input to a single quantizer, (2) by cascading multiple stages where each stage is configured such that the output of a low-order integrator serves as the input to a single quantizer, or (3) through the use of combinations of these two configurations. For a number of years, certain configurations of sigma-delta modulators have been readily and inexpensively realized for signals of interest at low or near zero frequencies. More recently, such has been the case for bandpass signals of fixed passband. Sigma-delta modulators have not heretofore been developed for bandpass signals with a tunable or variable frequency passband. Moreover, many configurations of higher order sigma-delta modulators suffer from reduced operational stability (e.g., overflow, oscillations, etc.) as the number of NTF transmission zeros is increased within the design bandwidth. Thus, the need exists for a sigma-delta modulator that can define a passband which can be tuned for a particular frequency and/or bandwidth of interest while maintaining operational stability.

SUMMARY OF THE INVENTION

The invention includes one or more sigma-delta modulators having a tuning range. The modulator(s) include a translator for tuning to a selected signal passband within the tuning range. In a network implementation of the present invention, the translator is integral with each of the integrators associated with the sigma-delta modulator(s). The translator can comprise a network having a transfer function defined in the Z-domain as $(Z\alpha-1)/[Z(Z-\alpha)]$, where $-1 \leq \alpha \leq 1$ defines the tuning. The value of $\alpha$ is defined by the relationship $\alpha = \cos(2\pi f_{gm}/f_s)$, where $f_{gm}$ is the geometric mean frequency of the passband and $f_s$ is the input sample frequency of the sigma-delta modulator(s). To prevent aliasing, $f_{gm} < 0.5 f_s$.

The advantages of the present invention are numerous. In general, any m-th order sigma-delta modulator can incorporate the invention's tuning transformation to provide a tunable passband. Thus, the present invention serves as a building block for a wide variety of signal processing applications that use sigma-delta modulators, such as for example, A/D, D/A and D/D converters; and digital communication systems including digital radio and digital TV. In the field of digital communications (e.g., radio, TV, etc.) the invention can be of great use where it is desirable to digitize the full tuning range or bandwidth of a receiver at an intermediate frequency early in the processing chain, thus allowing digital tuning or mixing of the desired signal. Such digital mixing or tuning overcomes the limitations of analog mixers/receivers, for example limited linearity in dynamic range as well as the problems associated with aliasing, artifacts, ghosts, harmonics, distortion, gain and phase mismatch, etc. Other advantages of the sigma-delta modulator of the present invention are that it provides variable bandwidth, is operationally stable and is easily and inexpensively realized.

DESCRIPTION OF THE PREFERRED EMBODIMENT

The present invention can be implemented in any m-th order sigma-delta modulator configured in any multiple loop or cascaded stage structure where $m \geq 1$. The order of the modulator is based on the number of integrator loops used to generate inputs for a quantizer. By way of example, the present invention will be described relative to a multiple-loop, second-order (two-integrator) sigma-delta modulator.

Figure 1:
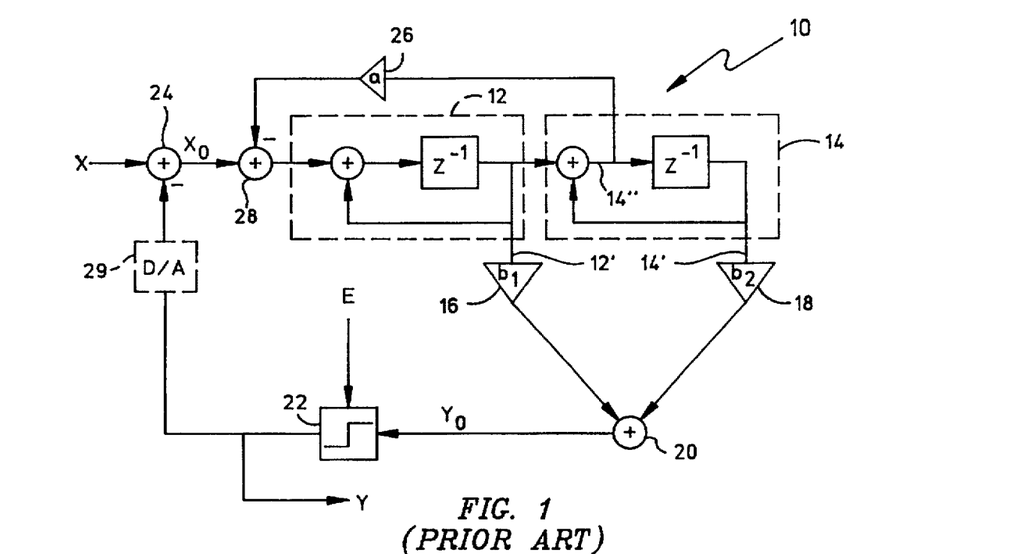
FIG. 1 is a network diagram of a prior art multiple-loop sigma-delta modulator.

A prior art multiple-loop, second-order sigma-delta modulator 10 is shown in FIG. 1. In terms of A/D conversion, sigma-delta modulator 10 operates on an oversampled (typically many times Nyquist) analog input X and outputs quantized output Y. Sigma-delta modulator 10 includes two integrators 12 and 14, each with local feedback from a one clock cycle delay element $Z^{-1}$. The feedback outputs 12' and 14' from respective integrators 12 and 14 are scaled by respective scaling elements 16 and 18 having respective scaling coefficients defined as $b_1$ and $b_2$. The scaled outputs from scaling elements 16 and 18 are summed at summing junction 20. The resulting summed output from summing junction 20 is fed to coarse quantizer 22. Quantizer 22 introduces quantization error "E" into the modulator's loop. The output from quantizer 22 is delivered to D/A converter 29 where the quantized signal is converted back to an analog signal which is then subtracted from sampled analog input X at input summing junction 24 to close the loop. The local feedback branch 14" of integrator 14 is scaled by scaling element 26 having a scaling coefficient "a". The scaled output from scaling element 26 is subtracted from loop input $X_0$ at summing junction 28. As is known in the art, scaling coefficients a, $b_1$, $b_2$ are used to fix the positions of the poles and zeros of the loop transfer function.

Quantizer 22 is typically a single-bit (i.e. two-level) A/D converter (i.e., a comparator). Quantizer 22, however, can be other multi-levels, for example, three levels or "1.5" bits, four levels or 2 bits, five levels or "2.5" bits, etc. Digital-to-analog (D/A) converter 29 is required to supply an analog feedback signal in sigma-delta modulator 10 when modulator 10 is used in an A/D configuration. Digital-to-analog converter 29 is not required for D/D or D/A configurations nor when quantizer 22 is fewer than multi-bit, thus it is shown as an "optional" dashed line box. Digital-to-analog converter 29 is required to have the same number of levels as quantizer 22. Further, since D/A converter 29 is in the feedback loop, it must exhibit the precision expected of the entire sigma-delta loop.

The (closed-loop) transfer function H(Z) of sigma-delta modulator 10 can be defined in the Z-domain by $$H(Z) = \frac{Y_0(Z)}{X_0(Z)} \quad (1)$$

where $X_0 \equiv$ the input to H(Z) and $Y_0 \equiv$ the output from H(Z). The linearized noise transfer function (NTF) of sigma-delta modulator 10 describing the quantization error is $$NTF(Z) = \frac{Y}{E} = \frac{1 + (a-2)Z^{-1} + Z^{-2}}{1 + (a - 2 + \lambda b_1)Z^{-1} + (1 + \lambda b_2 - \lambda b_1)Z^{-2}} \quad (2)$$

where E(Z) is the Z-domain transform of the noise generated by quantizer 22 and $\lambda$ is a parameter accounting for the linearized gain of quantizer 22. The value of X depends on the value of each analog input sample to quantizer 22 given that the output of the quantizer is dependent on the value of the analog input signal and the number of output levels/bits provided thereby. The scaling coefficient "a" controls the positions of the poles of the transfer function H(Z) along a pole-zero unit circle plot while the "b" scaling coefficients control the positions of the zeros of the transfer function H(Z). Since the transfer function poles are the (closed-loop) NTF zeros, the "a" coefficient controls the positions of the NTF zeros. The "b" coefficients in combination with the "a" coefficient and gain X of quantizer 22 control the positions of the (closed-loop) NTF poles and hence the stability of the closed-loop system. When the "a" coefficient is set equal to zero, the poles of the transfer function H(Z) are positioned at d.c. In addition, due to the relative size of the "b" coefficients, i.e., typically b>>a, and relationships within the (closed-loop) transfer functions, the positions of the closed-loop transfer function poles (for both signal and noise) are predominantly controlled by the "b" coefficients and quantizer gain $\lambda$.

In accordance with the present invention, it is possible to locate or tune the quantization error stopband (and thus the passband for the signal of interest) away from low or zero frequency. For the multiple-loop, second-order sigma delta modulator configuration, such tuning can be accomplished according to the invention by sigma-delta modulator 100 shown in FIG. 2.

For purpose of illustration, sigma-delta modulator 100 of FIG. 2 will be described as it relates to A/D conversion. Thus, elements common with those of modulator 10 have been preceded with a "1" for sigma-delta modulator 100 of FIG. 2. However, the present invention can also operate in both D/A and D/D conversion systems as will be explained.

In any of its uses, sigma-delta modulator 100 utilizes two transformation integrators 113 and 115, each of which incorporates tuning transformation G. Tuning transformation G is defined in the Z-domain by the transfer function $$G = \frac{Z\alpha - 1}{Z - \alpha} \quad (3)$$

with $$\alpha = \cos\left(2\pi \frac{f_{gm}}{f_s}\right) \quad (4)$$

where $f_{gm}$ is the geometric mean frequency of the signal passband as will be explained, and $f_s$ is the input sampling frequency of sigma-delta modulator 100.

Figure 3:
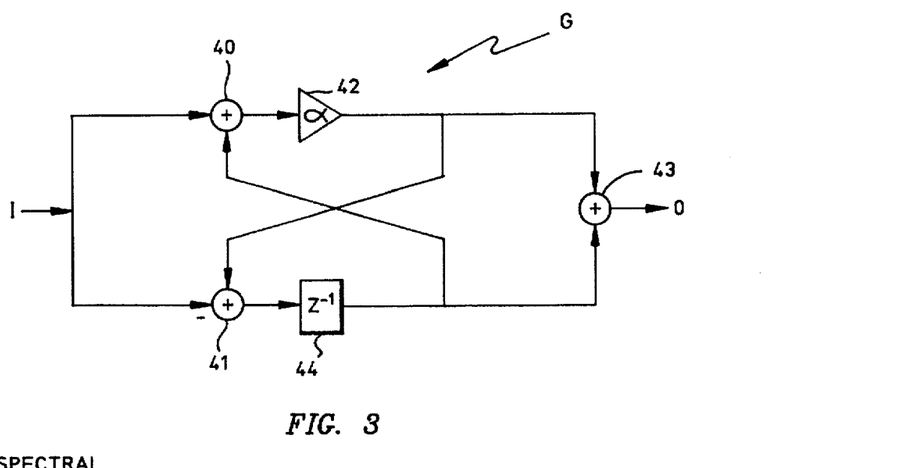
FIG. 3 is a preferred embodiment network implementation of the tuning transformation according to the present invention.

One of many possible network implementations of tuning transformation G is shown by way of example in FIG. 3 where an input signal I is fed to each of summing junctions 40 and 41. The output of summing junction 40 is scaled by scaling element 42 having scaling coefficient α defined above in equation (4). The scaled output from scaling element 42 is fed to summing junction 41 and output summing junction 43. Summing junction 41 subtracts input signal I from the scaled output of summing junction 40. The output of summing junction 41 is fed through time delay element 44 providing a unit of time delay $Z^{-1}$. The time delayed output from time delay 44 is fed to summing junction 40 and output summing junction 43 where output ) results. The resulting transfer function G=O/I is the tuning transformation given by equation (3) above.

As a result of incorporating tuning transformation G in each transformation integrator 113 and 115, the noise transfer function (NTF) for sigma-delta modulator 100 becomes $$NTF(Z) = \frac{1 + \alpha(a-4)Z^{-1} + [2-a-\alpha^2(a-4)]Z^{-2} + }{1 + \alpha(a-4+\lambda b_1)Z^{-1} +} \quad (5)$$

$$\frac{\alpha(a-4)Z^{-3} + Z^{-4}}{[\alpha^2(\lambda(b_2 - 2b_1) + 4 - a) - a + 2 - \lambda b_1]Z^{-2} +}$$

$$\alpha[a - 4 + \lambda(3b_1 - 2b_2)]Z^{-3} + \ldots [1 + \lambda(b_2 - b_1)]Z^{-4}$$

Figure 2:
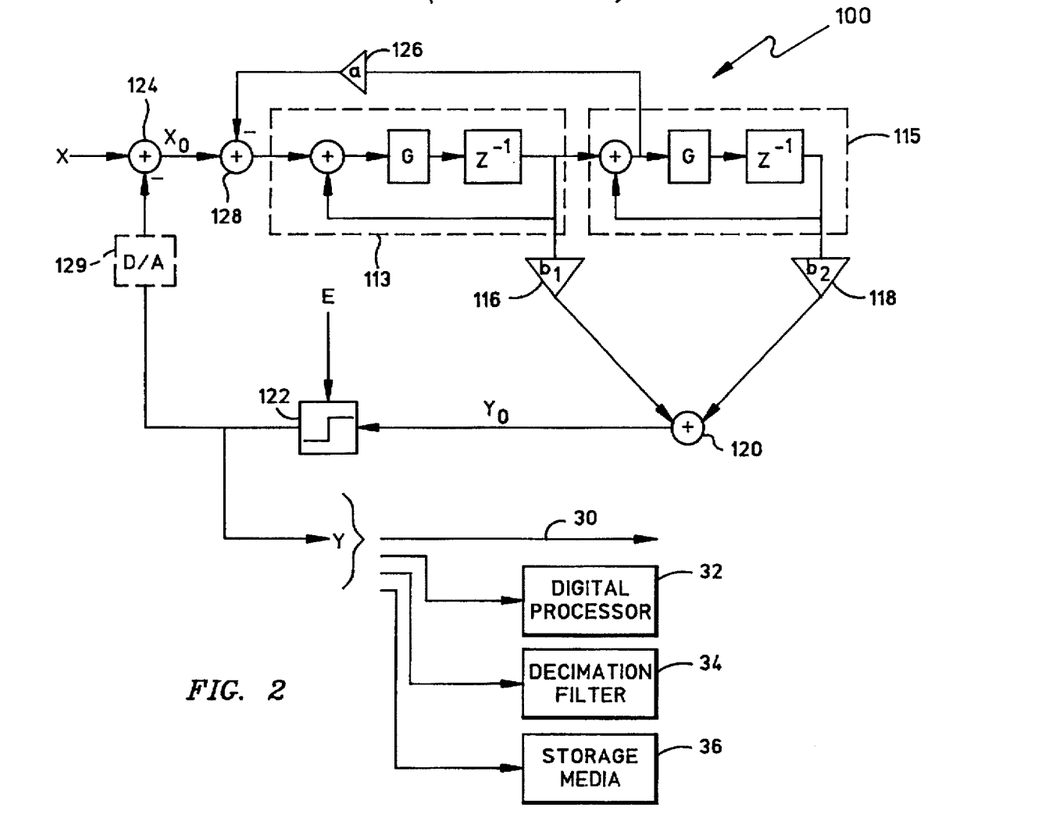
FIG. 2 is a network diagram of a multiple-loop sigma-delta modulator suitable for use in A/D conversions systems according to one embodiment of the present invention.

Thus, by incorporating tuning transformation G in each of the modulator's loops, the FIG. 2 embodiment of the invention essentially causes a second-order loop structure to operate as a fourth-order sigma-delta modulator.

Figure 4A:
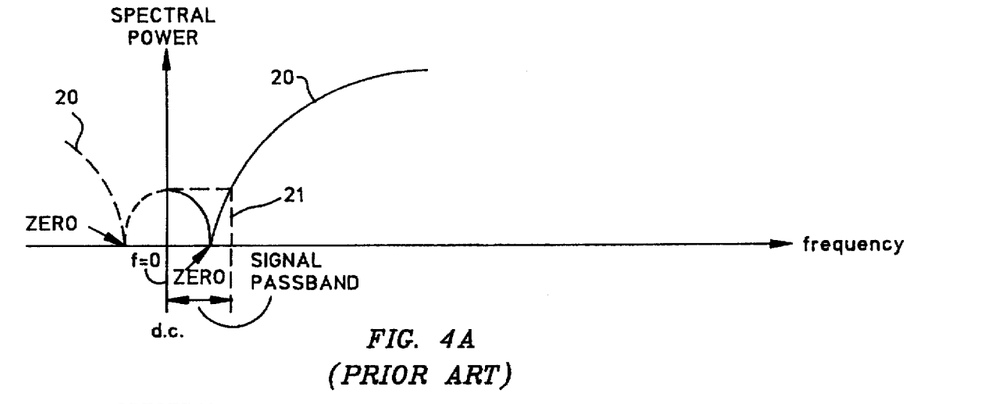
FIG. 4A is a plot of the quantization noise transfer function as a function of frequency for the prior art sigma-delta modulator of FIG. 1.

To see the effects of the invention, the frequency domain plots of quantization error (or the NTF of the modulator) are shown in FIGS. 4A–4E, where the x-axis represents frequency and the y-axis represents the spectral power of the quantization error. FIG. 4A is based on equation (2) for prior art sigma-delta modulator 10 of FIG. 1 and FIGS. 4B–4E are based on equation (5) for the novel sigma-delta modulator 100 of FIG. 2, both modulators being tuned for select locations in the frequency domain.

In FIG. 4A, the quantization error attenuation curve 20 has a pair of NTF transmission zeros symmetrically disposed about zero frequency. So called "negative" frequencies are represented by the dashed line portion of curve 20. The low pass bandwidth is defined from zero frequency to the band edge indicated by vertical dashed line 21. The "center" frequency of the signal passband, i.e., zero frequency, is really the lower band edge of the signal passband and not the center frequency of the signal passband.

However, with sigma-delta modulator 100, it is possible to shift or tune NTF pole/zero cancellation away from zero frequency so that the zeros previously occurring symmetrically about zero frequency can occur about an arbitrary positive frequency. This enables the signal passband (noise stopband) to be shifted or tuned across a wide variety of locations in the frequency domain. Based on tuning transformation G defined in equations (3) and (4), the signal passband can be tuned within the range $0 \leq f_{gm} \leq 0.5\ f_s$ for $-1 \leq \alpha \leq 1$, where the range of $f_{gm}$ defines the lowermost error stopband edge (i.e., $f_{gm}=0$) to the uppermost stopband edge (i.e., $f_{gm}=0.5\ f_s$) for a sigma-delta modulator based on the sampling frequency $f_s$.

The parameter $f_{gm}$ is defined herein as the geometric mean frequency between the lower and upper band edges of the signal passband (for uniform or Chebyshev noise attenuation characteristics of each NTF) within the tunable range of the signal passband. Note that the case $f_{gm}=0$ provides the same NTF curve as that given in FIG. 4A. This is consistent with $f_{gm}$ being the geometric mean of the upper and lower band edges of the signal passband.

Figure 4B:
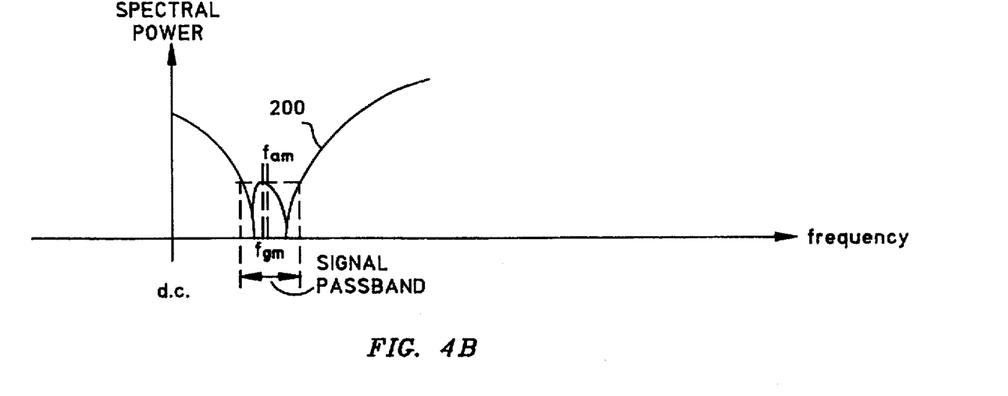
FIG. 4B is a plot of the quantization noise transfer function as a function of frequency for the sigma-delta modulator of the FIG. 2 embodiment of this invention for the case $0 < f_{gm} < 0.25\ f_s$.
Figure 4C:
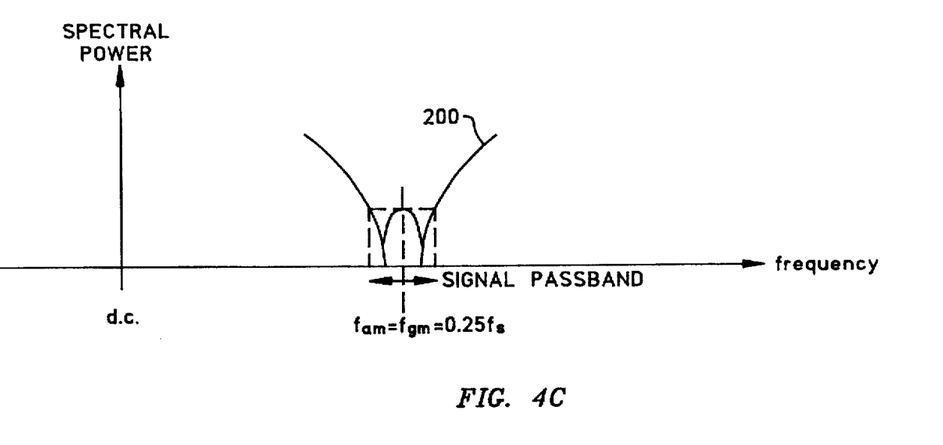
FIG. 4C is a plot of the quantization noise transfer function as a function of frequency for the sigma-delta modulator of the FIG. 2 embodiment of this invention for the case $f_{gm} = 0.25\ f_s$.
Figure 4D:
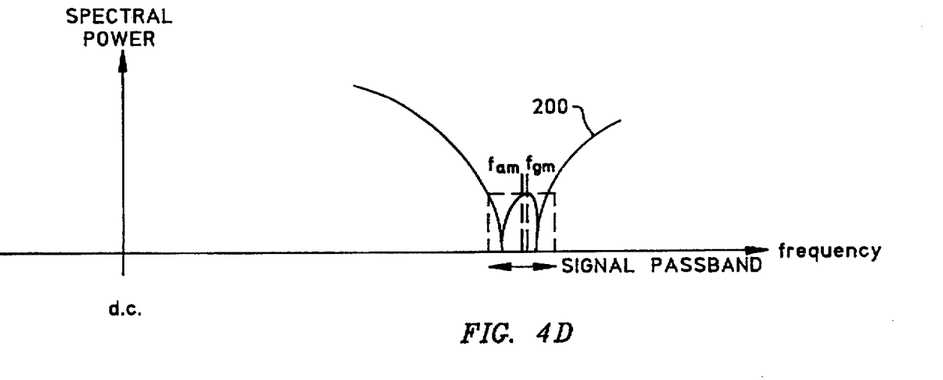
FIG. 4D is a plot of the quantization noise transfer function as a function of frequency for the sigma-delta modulator of the FIG. 2 embodiment of this invention for the case $0.25\ f_s < f_{gm} < 0.5\ f_s$.
Figure 4E:
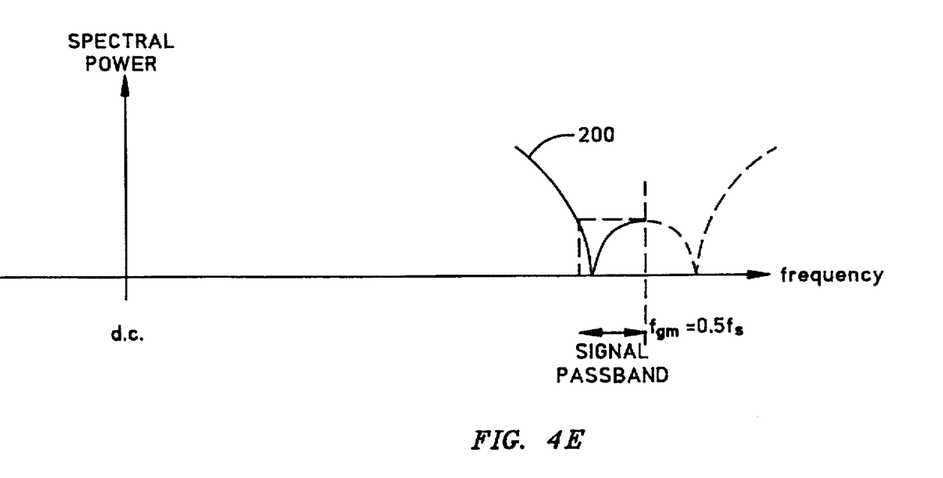
FIG. 4E is a plot of the quantization noise transfer function as a function of frequency for the sigma-delta modulator of the FIG. 2 embodiment of this invention for the case $f_{gm} = 0.5\ f_s$.

FIG. 4B represents a tuning case where $0 < f_{gm} < 0.25\ f_s$ such that geometric mean $f_{gm}$ falls to the left of algebraic mean $f_{am}$. (Note that the asymmetry of the spectrum in the neighborhood of the spectral nulls is exaggerated for clarity of presentation.) At $f_{gm}=0.25\ f_s$, geometric mean $f_{gm}$ is equal to algebraic mean $f_{am}$ as shown in FIG. 4C. FIG. 4D represents a tuning case where $0.25\ f_s < f_{gm} < 0.5\ f_s$ such that geometric mean $f_{gm}$ falls to the right of algebraic mean $f_{am}$. Finally, at $f_{gm}=0.5\ f_s$, the situation is similar to that at $f_{gm}=0$ only with reverse symmetry so that geometric mean $f_{gm}$ is the uppermost error stopband edge as shown in FIG. 4E. For all cases, curve 200 is symmetric about d.c. and $f_s$. In the range $0 < f_{gm} < 0.5\ f_s$, curve 200 is fourth-order. However, at the extremes $f_{gm}=0$ and $f_{gm}=0.5\ f_s$, the pole and zero of the transformation in equation (3) and (4) cancel so that curve 200 appears as second-order in FIGS. 4A and 4E. Further, the width of the signal passband shown is for purpose of illustration only. In use of the present invention, a circuit designer would select the size of the signal passband based on the dynamic range or the amount of quantization error suppression required. In the vast majority of applications, the signal passband is required to be very narrow relative to the full tuning range of the modulator.

Tuning transformation G provides the means to selectively tune the signal passband, away from zero or a low frequency, within a broad range of the frequency spectrum. Conventional tuning systems may be designed to make geometric mean $f_{gm}$ approach the algebraic mean $f_{am}$ (i.e., $f_{gm}=0.25\ f_s$) for centered tuning. This will more nearly be the case as the signal passband becomes narrower as is commonly the case for most applications.

As shown in FIG. 2, the output Y from sigma-delta modulator 100 can simply be transmitted over data channel 30. Output Y could also be input to digital processor 32 to undergo additional digital processing. Output Y could also be input to decimation filter 34 in which case sigma-delta modulator 100 and decimation filter 34 could be used to form a sigma-delta A/D converter. Still further, output Y could be input to storage media 36. Thus, it is apparent that sigma-delta modulator 100 will find great utility in a wide variety of signal processing applications.

Figure 5:
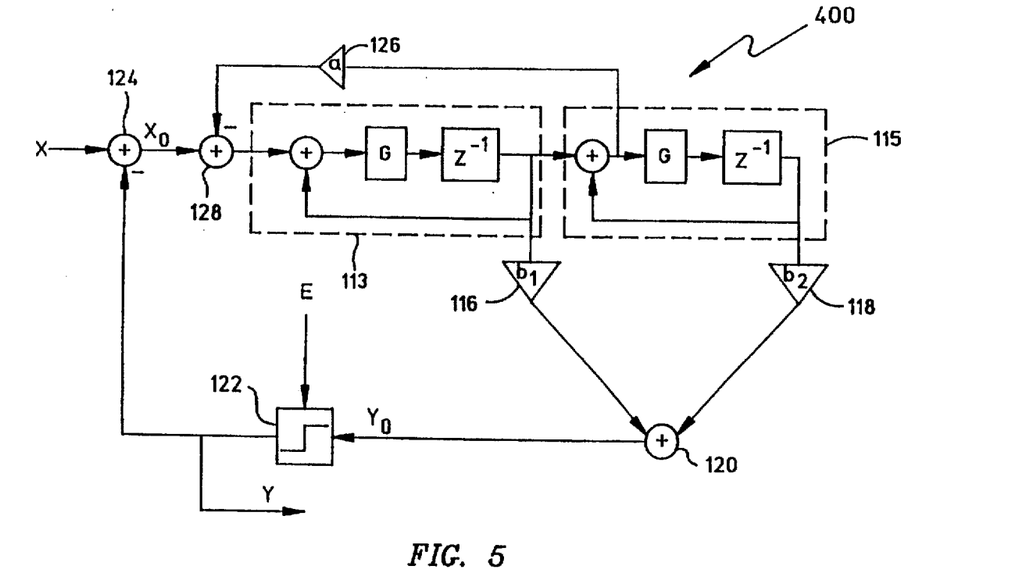
FIG. 5 is a network diagram of a multiple-loop sigma-delta modulator suitable for use in D/D conversions systems according to the present invention.
Figure 6:
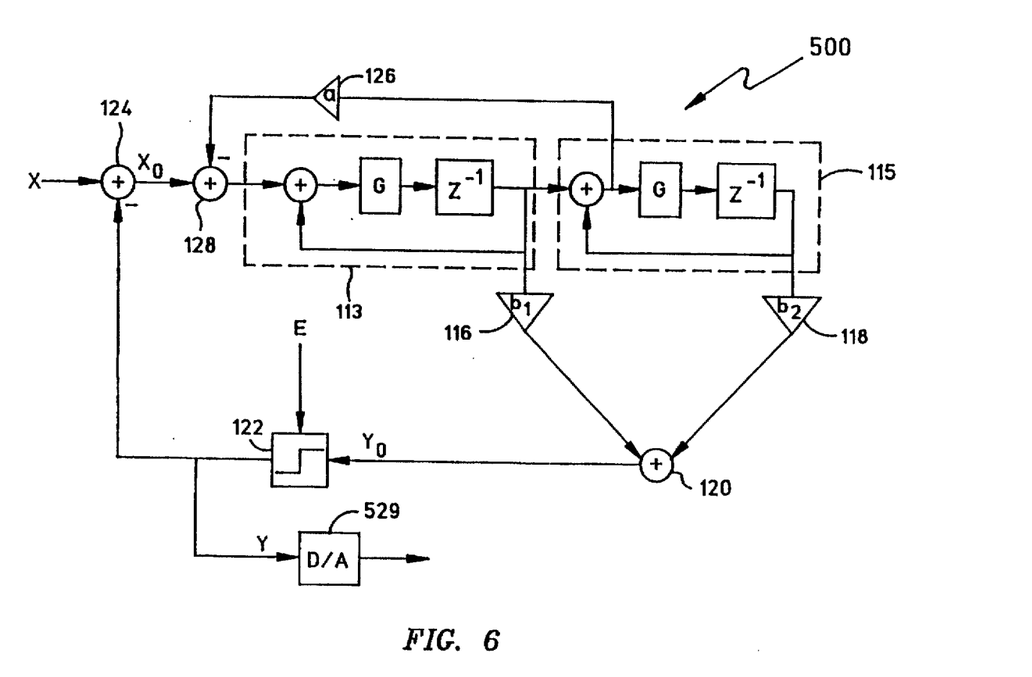
FIG. 6 is a network diagram of a multiple-loop sigma-delta modulator suitable for use in D/A conversions systems according to the present invention.

As mentioned above, sigma-delta modulator 100 can be slightly modified to be used as part of D/D or D/A conversion systems as represented respectively by sigma-delta modulator 400 in FIG. 5 and sigma-delta modulator 500 in FIG. 6. Like elements between modulator 100 and each of modulators 400 and 500 share common reference numerals. However, for D/D conversion systems, sigma-delta modulator 400 of FIG. 5 receives a digital input X and quantizer 122 is embodied by what is known as a digital requantizer that quantizes an incoming signal of $B_1$ bits to output a digital signal of $B_2$ bits where $B_1 > B_2$. Such digital requantization can be implemented algorithmically or by means of a look-up table as is known in the art. Similar to modulator 100, quantizer 122 in modulator 400 introduces quantization error "E" into the modulator's loop. Finally, D/A converter 129 used in modulator 100 of FIG. 2 is omitted from the network of modulator 400 since only digital signals pass through modulator 400. For D/A conversion systems, modulator 500 in FIG. 6 is configured as described above for modulator 400 except that output Y is fed to D/A converter 529 to generate the desired analog output signal. Thus, the essential features of the present invention remain the same for a sigma-delta modulator used in A/D, D/D or D/A conversion systems.

The present invention can also be extended to any m-th order multiple-loop or cascaded stage sigma-delta modulator structure simply by incorporating the above described tuning transformation into each integrator. Pole/zero analysis of such modulator structures proceeds in an analogous fashion to that described above relative to the multiple-loop, second-order sigma-delta modulator.

The linear model of multiple-loop m-th order sigma-delta modulators exhibits a NTF with multiple transmission zeros at or about zero frequency. The multiple zeros offer improved quantization noise power suppression in the passband. However, in reality, as the number of zeros in the linearized NTF increases, the number of bits in the quantizer required to assure unconditional stability must be proportionally increased. Thus, with few exceptions, m loops used with a single quantizer require an m-bit quantizer to assure stability for all amplitude levels.

One method of achieving high order loops is to build the high order loop and protect the loop from non-linear behavior by monitoring integrator outputs to detect the likelihood of overflow and respond to this condition by clamping the output of the offending integrator(s). An alternate scheme is to build low order (typically first-order) loops and place them in a cascaded (MASH) structure as taught by Matsaya et al. in "A 16-bit Oversampling A-to-D Conversion Technology Using Triple-Integration Noise Shaping", IEEE Journal of Solid-State Circuits, Vol. 22, No. 6, December 1987. The zeros of the first-order stages are located at zero frequency and the feed forward filtering required to cancel the noise of the previous stage is a simple differentiator.

Prior to the present invention, higher order filters that attempted to distribute the zeros did not lend themselves to the MASH structure technique of obtaining increased order loops because the noise canceling feed forward filter was too difficult to implement. Implementation of the distribution of transmission zeros for the NTF of any cascaded stage structure of second or greater order sigma-delta modulators is described briefly by way of example for the cascaded stage shown in FIG. 7 where the feed forward filter is a replicate of the previous feedback filter.

Figure 7:
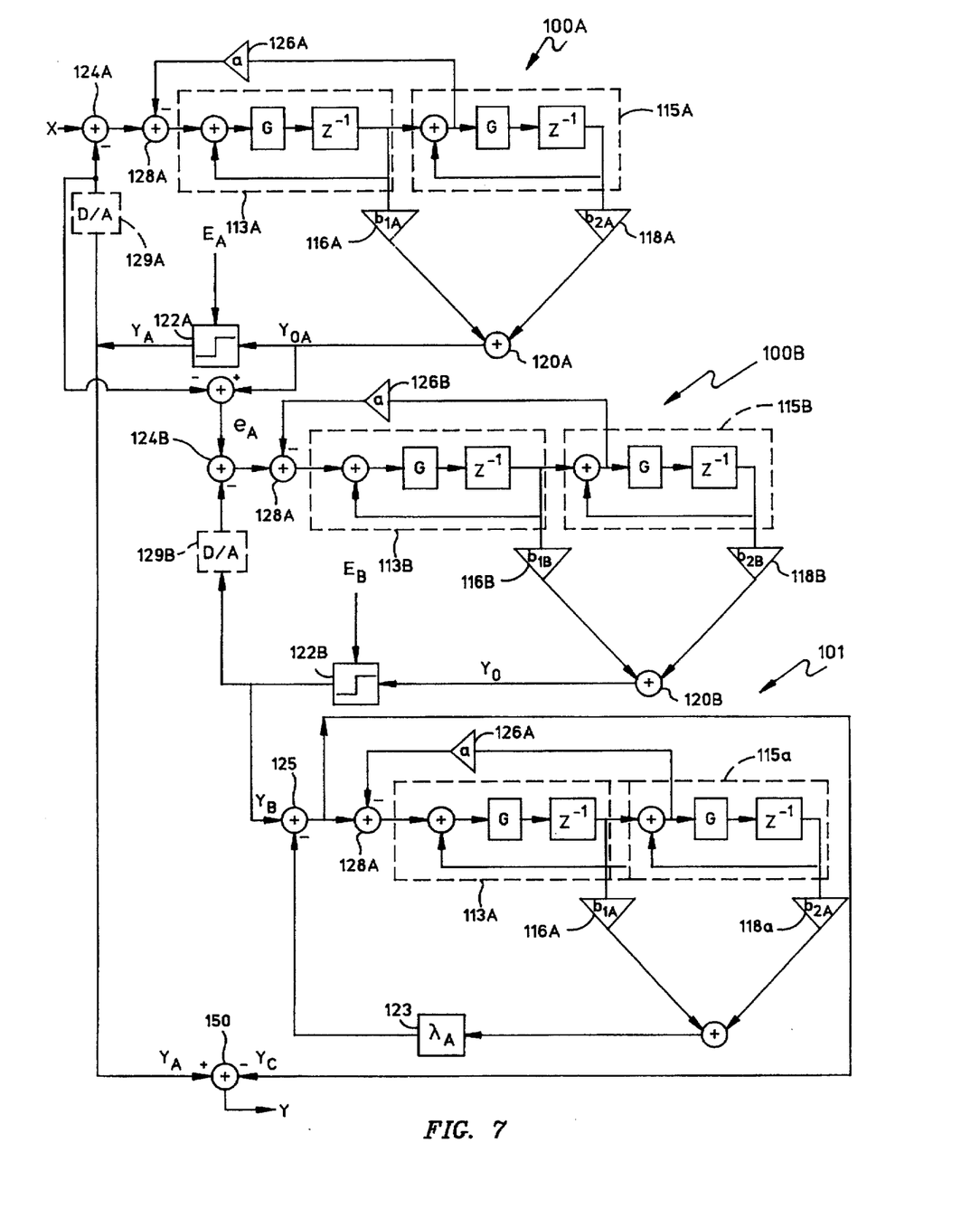
FIG. 7 is a network diagram of two sigma-delta modulators of the present invention cascaded together with a third, non-quantizing stage structure.

In FIG. 7, a cascaded arrangement of two second-order sigma-delta modulators 100A and 100B are cascaded with a third stage 101 having no quantizer. Each of sigma-delta modulators 100A and 100B is constructed as described above for the FIG. 2 embodiment of sigma-delta modulator 100 where like elements between the embodiments of FIGS. 2 and 7 have been provided with like reference numerals appended with "A" or "B" as appropriate. Thus, the network in FIG. 7 relates to A/D conversion systems. However, the cascaded arrangement could easily be extended for use in D/A and D/D conversion systems in a manner similar to that described above.

Stage 101 is nearly identical to that of sigma-delta modulator 100A (i.e., the (signal) transfer function of stage 101 is approximately identical to the NTF of sigma-delta modulator 100A) where like elements between modulator 100A and stage 101 share common reference numerals. The exception is that quantizer 122A in modulator 100A is replaced in stage 101 with gain element 123.

The "gain" of quantizer 122A is a memoryless non-linear function of the input amplitude $Y_{OA}$. The constant (linear) gain $\lambda_A$ of gain element 123 is a scale factor representing an average gain of the quantizer and is not absorbed in the loop coefficients $b_{1A}$ and $b_{2A}$ to emphasize the congruence between loops 100 and 101.

Ideally, stage 101 forms an STF equal to the NTF of modulator 100A. However, since the gain of quantizer 122A varies with each analog input sample, gain $\lambda_A$ of gain element 123 must be chosen such that the STF of stage 101 is approximately equal to the NTF of modulator 100A in order to best cancel the noise from the modulator. In general, gain $\lambda_A$ is selected to be a closest approximation to the gain of quantizer 122A to achieve optimum noise shaping for given dynamic range and bandwidth requirements. For example, gain $\lambda_A$ might be a time averaged value or a "best fit" curve to a sampling of gain values for quantizer 122A.

In operation, quantization error $E_A$ is introduced by quantizer 122A and is isolated by subtracting, at summing junction 130, the output $Y_A$ of quantizer 122A (in its analog form as converted by D/A converter 129A) from the input $Y_{OA}$ of quantizer 122A. Thus, quantization error $E_A$ serves as the input to modulator 100B at summing junction 124B. The quantization error resulting from the combination of modulators 100A and 100B, or $Y_B = (E_A)STF_{100B} - (E_S)NTF_{100B}$ (where $STF_{100B}$ is the signal transfer function of modulator 100B and $NTF_{100B}$ is the NTF of modulator 100B), is then input to stage 101 at summing junction 125. Finally, the digital output $Y_C$ from stage 101 is subtracted from the digital output $Y_A$ from modulator 100A at summing junction 150. The NTF's transmission zero distribution is accomplished by setting the "a" coefficients to different values for each of modulator's 100A and 100B. As the value of the "a" scaling coefficient increases from zero, the multiple NTF zeros move away from d.c.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. An apparatus comprising a sigma-delta modulator having a tuning range, said sigma-delta modulator including a translator for tuning to a selected passband within said tuning range.

2. An apparatus as in claim 1 wherein said sigma-delta modulator includes m (a positive integer) integrators and wherein said translator is integral with each of said m integrators.

3. An apparatus as in claim 1 wherein said translator has a transfer function defined in the Z-domain as $(Z\alpha - 1)/(Z - \alpha)$, wherein $-1 \leq \alpha \leq 1$ defines said tuning range.

4. An apparatus as in claim 3 wherein $\alpha=\cos(2\pi f_{gm}/f_s)$, where $f_{gm}$ is a geometric mean frequency of said passband and $f_s$ is a sample frequency of said sigma-delta modulator.

5. An apparatus as in claim 1 wherein said sigma-delta modulator includes a multi-level quantizer.

6. An apparatus as in claim 1 wherein said sigma-delta modulator includes a single-bit quantizer.

7. An apparatus as in claim 1 further comprising a decimation filter operatively connected to an output of said sigma-delta modulator, said decimation filter for operation within said passband.

8. An apparatus as in claim 1 wherein said sigma-delta modulator comprises a plurality of multiple-loop sigma-delta modulators arranged in a cascaded architecture.

9. An apparatus as in claim 8 wherein each of said plurality of multiple-loop sigma-delta modulators is of m-th order where $m \leq 2$.

10. An apparatus as in claim 9 wherein each of said plurality of multiple-loop sigma-delta modulators includes m integrators and wherein said translator is integral with each of said m integrators.

11. An apparatus as in claim 10 wherein said translator has a transfer function defined in the Z-domain as $(Z\alpha-1)/(Z-\alpha)$, wherein $-1 \leq \alpha \leq 1$ defines said tuning range.

12. An apparatus as in claim 11 wherein $\alpha=\cos(2\pi f_{gm}/f_s)$, where $f_{gm}$ is a geometric mean frequency of said passband and $f_s$ is a sample frequency of said plurality of multiple-loop sigma-delta modulators.

13. An apparatus as in claim 8 wherein transmission zeros of the noise transfer function associated with said plurality of multiple-loop sigma-delta modulators are distributed across said passband.

14. An apparatus as in claim 8 further comprising a decimation filter operatively connected to an output of said plurality of multiple-loop sigma-delta modulators, said decimation filter for operation within said passband.

15. An apparatus as in claim 8 wherein each of said plurality of multiple-loop sigma-delta modulators includes a multi-level quantizer.

16. An apparatus as in claim 8 wherein each of said plurality of multiple-loop sigma-delta modulators includes a single-bit quantizer.

17. An apparatus comprising a sigma-delta modulator having m (a positive integer) integrators, each of said m integrators having a transfer function defined in the Z-domain as $(Z\alpha-1)/(Z-\alpha)$, wherein $-1 \leq \alpha \leq 1$.

18. An apparatus as in claim 17 wherein $\alpha=\cos(2\pi f_{gm}/f_s)$, where $f_{gm}$ is a geometric mean frequency of a passband of said sigma-delta modulator and $f_s$ is a sample frequency of said sigma-delta modulator.

19. An apparatus as in claim 17 wherein said sigma-delta modulator includes a single-bit quantizer.

20. An apparatus as in claim 17 wherein said sigma-delta modulator includes a multi-level quantizer.

21. An apparatus as in claim 17 further comprising a decimation filter operatively connected to an output of said sigma-delta modulator.

\* \* \* \* \*